United States Patent
Knoedgen et al.

(10) Patent No.: US 10,680,614 B1
(45) Date of Patent: Jun. 9, 2020

(54) CIRCUIT AND METHOD FOR ULTRA-HIGH-VOLTAGE TO LOW-VOLTAGE LEVEL SHIFTING

(71) Applicant: Dialog Semiconductor (UK) Limited, London (GB)

(72) Inventors: Horst Knoedgen, Munich (DE); Nebojsa Jelaca, Graz (AT); Christoph N. Nagl, Graz (AT)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/568,878

(22) Filed: Sep. 12, 2019

(30) Foreign Application Priority Data

Apr. 30, 2019 (DE) .................. 10 2019 206 188

(51) Int. Cl.
| | |
|---|---|
| *H03L 5/00* | (2006.01) |
| *H03K 3/00* | (2006.01) |
| *H03K 19/0185* | (2006.01) |
| *H03K 5/24* | (2006.01) |
| *H03K 3/037* | (2006.01) |

(52) U.S. Cl.
CPC ..... *H03K 19/018528* (2013.01); *H03K 3/037* (2013.01); *H03K 5/2481* (2013.01)

(58) Field of Classification Search
CPC ... H03K 19/0185; H03K 3/037; H03K 5/2481
See application file for complete search history.

(56) References Cited

U.S. PATENT DOCUMENTS

| | | | |
|---|---|---|---|
| 7,049,850 B2 | 5/2006 | Shimizu | |
| 8,598,916 B2* | 12/2013 | Miller | H03K 19/018521 327/108 |
| 8,975,944 B2* | 3/2015 | Akahane | H03K 3/356182 326/62 |
| 9,654,087 B1* | 5/2017 | Feldtkeller | H03K 3/356086 |
| 9,806,698 B1 | 10/2017 | Mengad | |

(Continued)

FOREIGN PATENT DOCUMENTS

| | | |
|---|---|---|
| DE | 10 2004 019 886 | 11/2004 |
| DE | 10 2017 205 781 | 6/2018 |

OTHER PUBLICATIONS

German Office Action, File No. 10 2019 206 188.5, Applicant: Dialog Semiconductor (UK) Limited, dated Jan. 29, 2020, 5 pages and English language translation, 5 pages.

*Primary Examiner* — Kenneth B Wells
(74) *Attorney, Agent, or Firm* — Saile Ackerman LLC; Stephen B. Ackerman

(57) ABSTRACT

The present document describes a level-shifter circuit and method to transmit data from a high-voltage domain to a low-voltage domain. The level-shifter circuit has a first current path with a first current control unit to set a first current based on a high-voltage data signal in the high-voltage domain; and a second current path with a second current control unit to set a second current based on the high-voltage data signal. Furthermore, the circuit has an isolation unit to transfer the first current and the second current from the high-voltage domain to the low-voltage domain; and a current comparator unit to compare the first current with the second current to provide a low-voltage data signal in the low-voltage domain, which corresponds to the high-voltage data signal.

15 Claims, 7 Drawing Sheets

(56) References Cited

U.S. PATENT DOCUMENTS

| | | | |
|---|---|---|---|
| 9,979,397 B1 * | 5/2018 | Zhu | H03K 5/19 |
| 10,396,167 B2 * | 8/2019 | Tanaka | H01L 29/405 |
| 10,547,309 B2 * | 1/2020 | Tezuka | H02M 7/5387 |
| 10,560,008 B2 * | 2/2020 | Qin | B62D 5/0421 |
| 2012/0081149 A1 | 4/2012 | Akahane | |

* cited by examiner

US 10,680,614 B1

CIRCUIT AND METHOD FOR ULTRA-HIGH-VOLTAGE TO LOW-VOLTAGE LEVEL SHIFTING

TECHNICAL FIELD

The present document relates to a circuit for transferring a data signal from a high-voltage domain to a low-voltage domain, notably for use within a switched power converter.

BACKGROUND

A half bridge comprising a high-side switch and a low-side switch, which are coupled via an intermediate node (also referred to as the LX node) may be operated using a gate control signal in a high-voltage domain for the high-side switch and a gate control signal in a low-voltage domain for the low-side switch. The gate control signal in the low-voltage domain may be derived from the gate control signal in the high-voltage domain, e.g. for generating complementary gate control signals.

Using Gallium Nitride (GaN) technology, relatively high drain-source voltage (e.g. Vds=650V) N-channel field effect transistors (FETs) are available. On the other hand, the drain-source voltage Vds of a P-channel FET is typically limited to 200V or lower. Using an N-channel transistor of 650V, an UHV (ultra-high voltage) level shifter may be provided, when transferring a data signal from the low-voltage domain to the high-voltage domain. In order to transfer data from the high-voltage domain to the low-voltage domain a P-channel transistor with a high breakdown voltage (e.g. in the range of 650V) would be required, which is, however, not available.

SUMMARY

The present document addresses the technical problem of providing a circuit for transferring a data signal from a high-voltage domain to a low-voltage domain in an efficient and reliable manner.

According to an aspect, a level-shifter circuit configured to transmit data from a high-voltage domain to a low-voltage domain is described. The level-shifter circuit comprises a first current path with a first current control unit configured to provide or to set a first current based on a high-voltage data signal in the high-voltage domain; and a second current path with a second current control unit configured to provide or to set a second current based on the high-voltage data signal. Furthermore, the circuit comprises an isolation unit configured to transfer the first current and the second current from the high-voltage domain to the low-voltage domain; and a current comparator unit (within the low-voltage domain) configured to compare the first current with the second current to provide a low-voltage data signal in the low-voltage domain, which corresponds to the high-voltage data signal.

According to a further aspect, a method for transmitting data from a high-voltage domain to a low-voltage domain is described. The method comprises generating and/or setting a first current and a second current based on a high-voltage data signal in the high-voltage domain. Furthermore, the method comprises transferring the first current and the second current from the high-voltage domain to the low-voltage domain. In addition, the method comprises comparing the first current with the second current (within the low-voltage domain) to provide a low-voltage data signal in the low-voltage domain, which corresponds to the high-voltage data signal.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

As outlined above, the present document is directed at providing a level-shifter circuit for transferring a data signal from the high-voltage domain (e.g. in the range of 600V or more) to the low-voltage domain (e.g. in the range of 200V or less).

Figure 1:
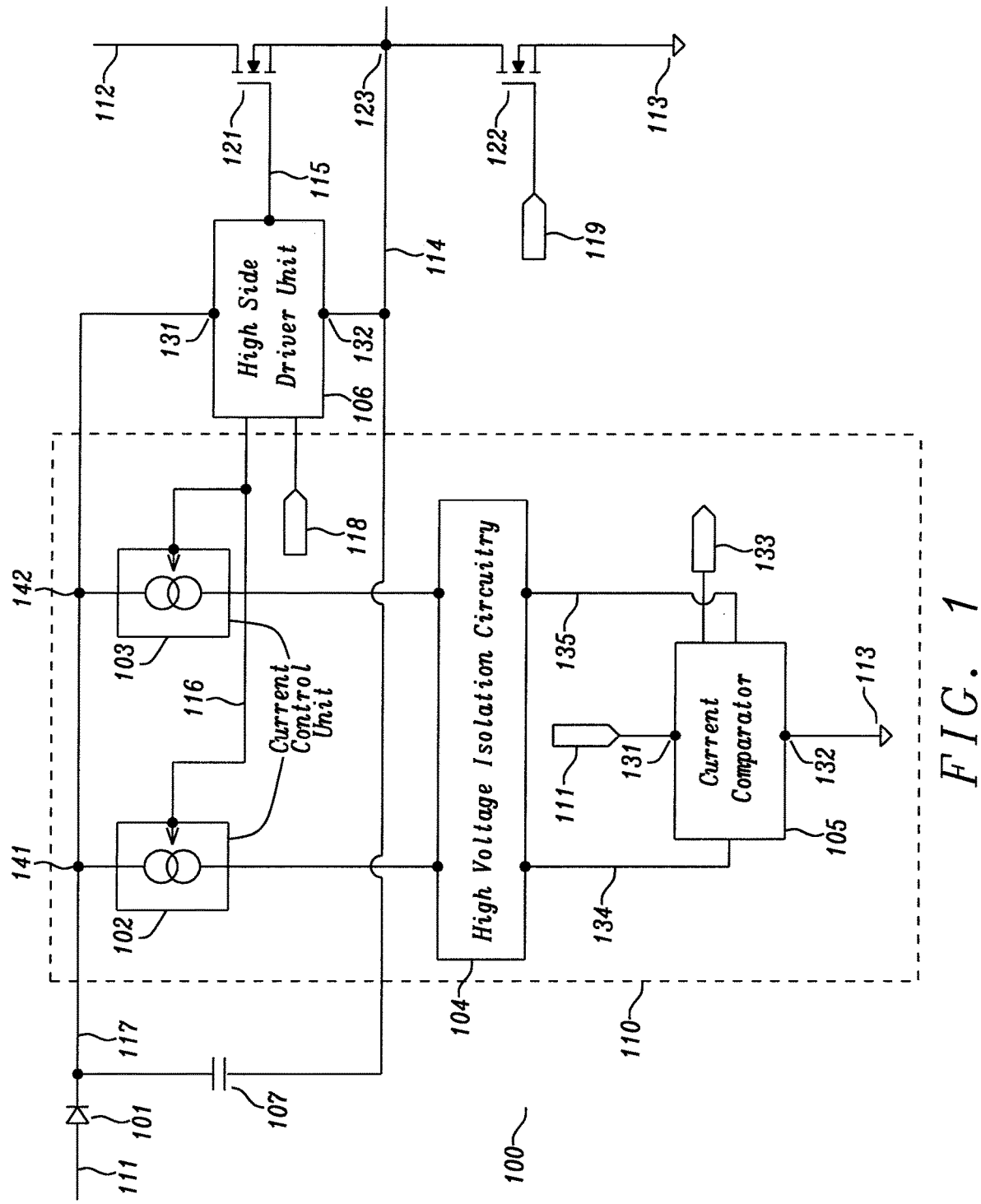
FIG. 1 shows a block diagram of an example level-shifter circuit.

FIG. 1 shows an example circuit 100 which comprises a half bridge comprising a high-side switch 121 which is coupled to a low-side switch 122 via an intermediate node 123. The half bridge is arranged between an input potential 112 and a reference potential 113 (e.g. ground). The high-side switch 121 is controlled using a high-side control signal 115 (which is applied to the gate of the high-side switch 121), and the low-side switch 122 is controlled using a low-side control signal 119 (which is applied to the gate of the low-side switch 122).

The high-side control signal 115 may be generated using a high-side driver 106 which exhibits supply ports 131, 132 for providing a supply voltage 111 to the high-side driver 106. The supply voltage may be provided as the different between a boot potential 117 (which may be provided via a diode 101 from the supply voltage 111) and by the intermediate potential 114. The boot potential 117 may be derived from the intermediate potential 114 via a capacitor 107. In particular, the boot potential 117 may be such that the boot potential 117 corresponds to the sum of the intermediate potential 114 and the supply voltage 111 minus the voltage drop of diode 101. The high-side control signal 115 may be generated in dependence of a master control signal 118.

The intermediate potential 114 may vary between the reference potential 113 (in case the low-side switch 122 is closed) and the input potential 112 (in case the high-side switch 121 is closed). As a result of this, the boot potential 117 may be relatively high (in the range of the input potential 112), e.g. 600V or higher. Hence, the high-side driver 106 may be operated in a high-voltage domain.

On the other hand, the low-side control signal 119 is constantly arranged relative to the reference potential 113, such that a low-side driver for providing the low-side control signal 119 is operated in a low-voltage domain.

The high-side driver 106 may be configured to provide a data signal 116, which may e.g. indicate the state or the level of the high-side control signal 115. The data signal 116 may e.g. be used to control the low-side switch 122 in a complementary manner to the high-side switch 121. In view of the fact that the data signal 116 is arranged relative to the intermediate potential 114 (which may be equal to the input potential 112), the data signal 116 cannot be coupled directly to the low-side driver within the low-voltage domain.

FIG. 1 shows an example level shifter circuit 110 which is configured to generate a low-voltage data signal 133 within the low-voltage domain from a high-voltage data signal 116 within the high-voltage domain. The circuit 110 comprises two current paths 141, 142, wherein each current path 141, 142 comprises a current control unit 102, 103. In particular, the first current path 141 comprises a first current control unit 102 for generating a first current 134, and the second current path 142 comprises a second current control unit 103 for generating a second current 135.

The first and second currents 134, 135 are different from one another, wherein the difference may be indicative of the information and/or data comprised within the high-voltage data signal 116. By way of example, the first current 134 may be higher than the second current 135, if the high-voltage data signal 116 exhibits a high level, and the first current 134 may be lower than the second current 135, if the high-voltage data signal 116 exhibits a low level (or vice versa).

The first and second currents 134, 135 may be provided from the high-voltage domain to the low-voltage domain via high-voltage (HV) isolation circuitry 104. Furthermore, a current comparator 105 may be provided (which may be operated between the supply potential 111 and the reference potential 113) to provide the low-voltage data signal 133 based on the difference between the first current 134 and the second current 135.

Hence, FIG. 1 illustrates a circuit 110 of transmitting information from the UHV (ultra-high voltage) to the LV (low voltage) domain. The circuit 110 generates two differential currents 134, 135, Ia 134 in the A-path 141 and Ib 135 in the B-path 142, which are different from one another, wherein the amount of the difference depends on the HV data signal 116. For example, if the data signal 116 is "1" then Ia>Ib, otherwise if the data signal 116 is "0" then Ib>Ia (or vice versa). The currents 134, 135 may be fed to the low-voltage domain via the HV isolation unit 104 (e.g. via a HV resistor and a MOSFET on each path 141, 142) and may be compared using a differential current comparator 105. The output 133 of the comparator 105 is a reconstruction of the data signal 116 from the UHV domain.

Figure 2A:
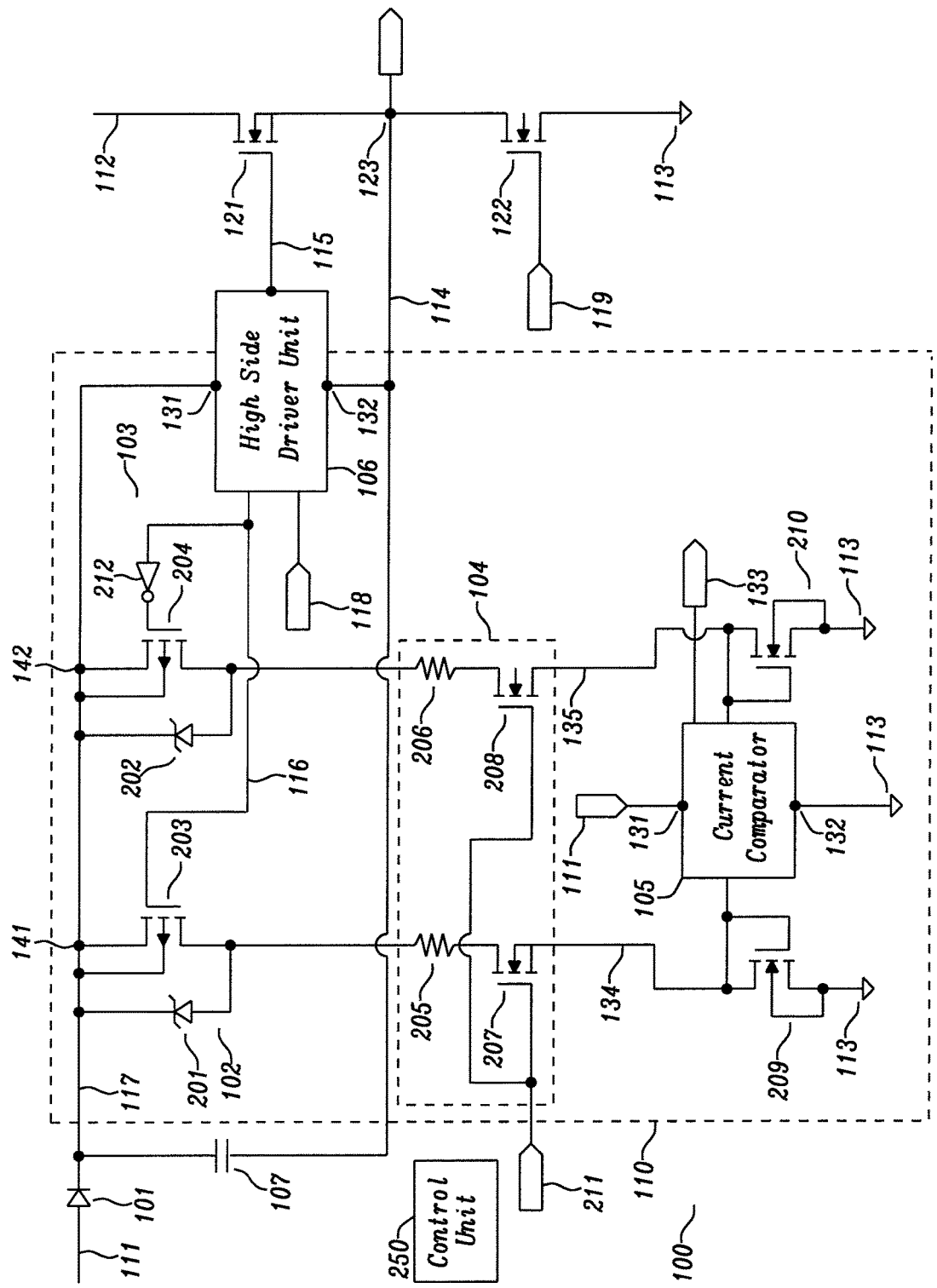
FIGS. 2A and 2B shows circuit diagrams of example level-shifter circuits.
Figure 2B:
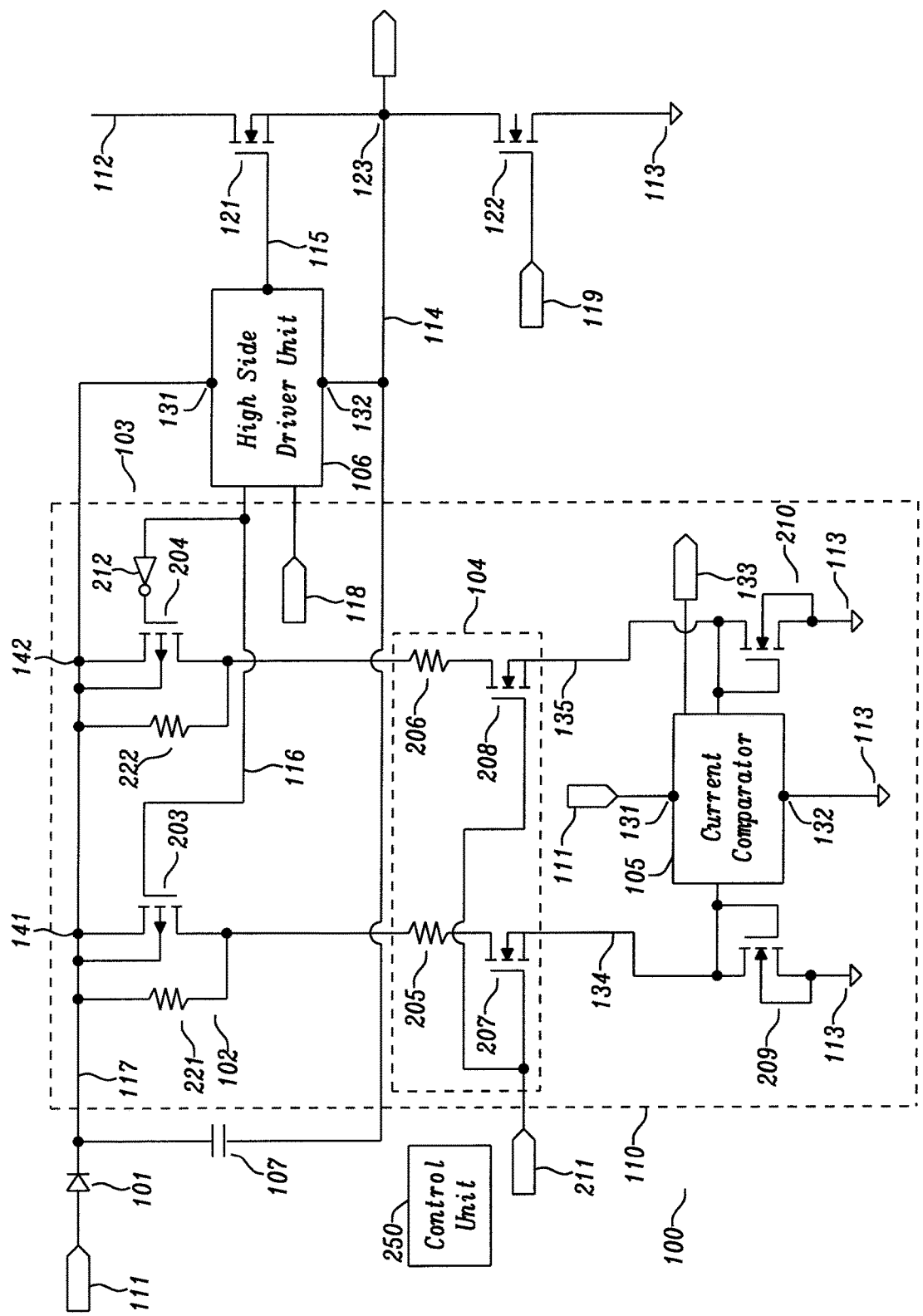

FIG. 2A shows an example implementation of the UHV level shifter 110 using Zener diodes 201, 202 and using transistors 203, 204 as current control units. As indicated above, the differential current may be used for information coding. The circuit 110 comprises two current paths 141, 142, which are controlled by the inverted and non-inverted data signal 116 (wherein the data signal 116 is inverted using the inverter 212). Both current paths 141, 142 comprise a Zener diode 201, 202, a low-voltage PMOS transistor 203, 204 (forming the current control units 102, 103. Furthermore, both paths 141, 142 comprise a high-voltage (silicon chromium) resistor 205, 206 and a high-voltage isolation N-channel GaN FET 207, 208 (for HV isolation 104). In addition, both paths 141, 142 comprise a drain-gate connected low-voltage NMOS device 209, 210 for current sensing.

During the high-side operation (when the high-side switch 121 is closed), the boot voltage 117 is relatively high (the sum of the input potential 112 and the supply voltage Vdd 111), e.g. several hundreds of Volts. It may be assumed that the data signal 116 is high and both HV isolation FETs 207, 208 are turned on. In case the data signal 116 is high, the current control unit transistor 203 of current path A 141 is closed. For the current path A 141, it can be written $$Ia = (Vboot - Vzener - Vgs\_M5)/(R1 + Rds\_on\_M3)$$

wherein Vboot is the boot potential 117, Vzener is the voltage across the Zener diode 201, Vgs_M5 is the gate-source voltage of the sensing transistor 209, R1 is the resistance of the isolation resistor 205, and Rds_on_M3 is the on-resistance of the isolation transistor 207.

For the current path B 142, the current control unit transistor 205 M2 is driven by the inverted data signal 116 and is turned on. The current Ib 135 can be written as follows:

$$Ib = (Vboot - Vgs\_M6)/(Rds\_on\_M2 + R2 + Rds\_on\_M4)$$

wherein Vboot is the boot potential 117, Vgs_M6 is the gate-source voltage of the sensing transistor 210, R2 is the resistance of the isolation resistor 206, Rds_on_M2 is the on-resistance of the current control unit transistor 204, and Rds_on_M4 is the on-resistance of the isolation transistor 208.

Assuming Vboot>>Vgs and R1=R2=R>>Rds_on it can be written:

$$Ib - Ia \approx (Vboot/R) - ((Vboot - Vzener)/R) = Vzener/R$$

It can be seen that the differential current depends approximately on the Zener voltage and the value of high-voltage SiCr resistor 205, 206. Another important function of the Zener diode 201, 202 is to protect the low-voltage PMOS devices M1 and M2 203, 204 from high voltages (i.e. Vzener<Vds_breakdown_pmos of the transistors 203, 204) when the high-voltage GaN isolation FETs 207, 208 are turned on during data communication. The transistors 207, 208 may be turned on selectively for data communication using the control signal 211, thereby reducing the power consumption of the level shifter circuit 110.

The circuit 110 makes use of high-voltage resistors R1 and R2 205, 206, which may be implemented using GaN technology which enables the use of silicon-chromium (SiCr) resistors with relatively good matching properties. The high-voltage capability of the SiCr resistors may be achieved using an isolation GaN layer (drain material).

The currents 134, 135 within the level shifter circuit 110 in combination with relatively high voltages typically generate considerable power loss, if turned on constantly. For this reason, the isolation GaN FETs 207, 208 may be controllable using the control signal 211 and may be turned off during idle mode, thereby reducing the power consumption.

The Zener diodes D2 and D3 201, 202 in FIG. 2A may be replaced with resistors R1 and R2 221, 222 (as shown in FIG. 2A), which form a voltage divider with the isolation resistors R3 and R4 205, 206. The resistor divider in the A and B paths 141, 142 defines the maximum drain voltage across the current control unit transistors M1 and M2 203, 204, wherein the maximum drain voltage also depends on the maximum Vbulk (i.e. the input potential 112, Vboot 117 and the values of the current control unit resistors R1 and R2 221, 222.

It may be assumed that the data signal 116 is high and both HV isolation FETs 207, 208 are turned on. In this case, the current control unit transistor 203 in current path A 141 is closed. For the current path A 141, it can be written:

$$Ia=(Vboot-Vgs\_M5)/(R3+R1+Rds\_on\_M3)$$

For the current path B 142, the current control unit transistor 204 M2 is driven by the inverted data signal 116 and is turned on. The current Ib can be written as follows:

$$Ib=(Vboot-Vgs\_M6)/((R2 \cdot Rds\_on\_M2)/(R2+Rds\_on\_M2)+R4+Rds\_on\_M4)$$

Assuming Vboot>>Vgs, R3=R4=Ra and R1=R2=Rb>>Rds_on it can be written:

$$Ib-Ia2 \approx Vboot \cdot Ra/(Rb \cdot (Ra+Rb))$$

The current control unit resistors R1 and R2 221, 222 may be designed such that the Vds of the PMOS devices M1 and M2 203, 204 does not exceed the maximum breakdown voltage, when the high-voltage GaN isolation FETs 207, 208 are turned on during data communication.

Figure 3:
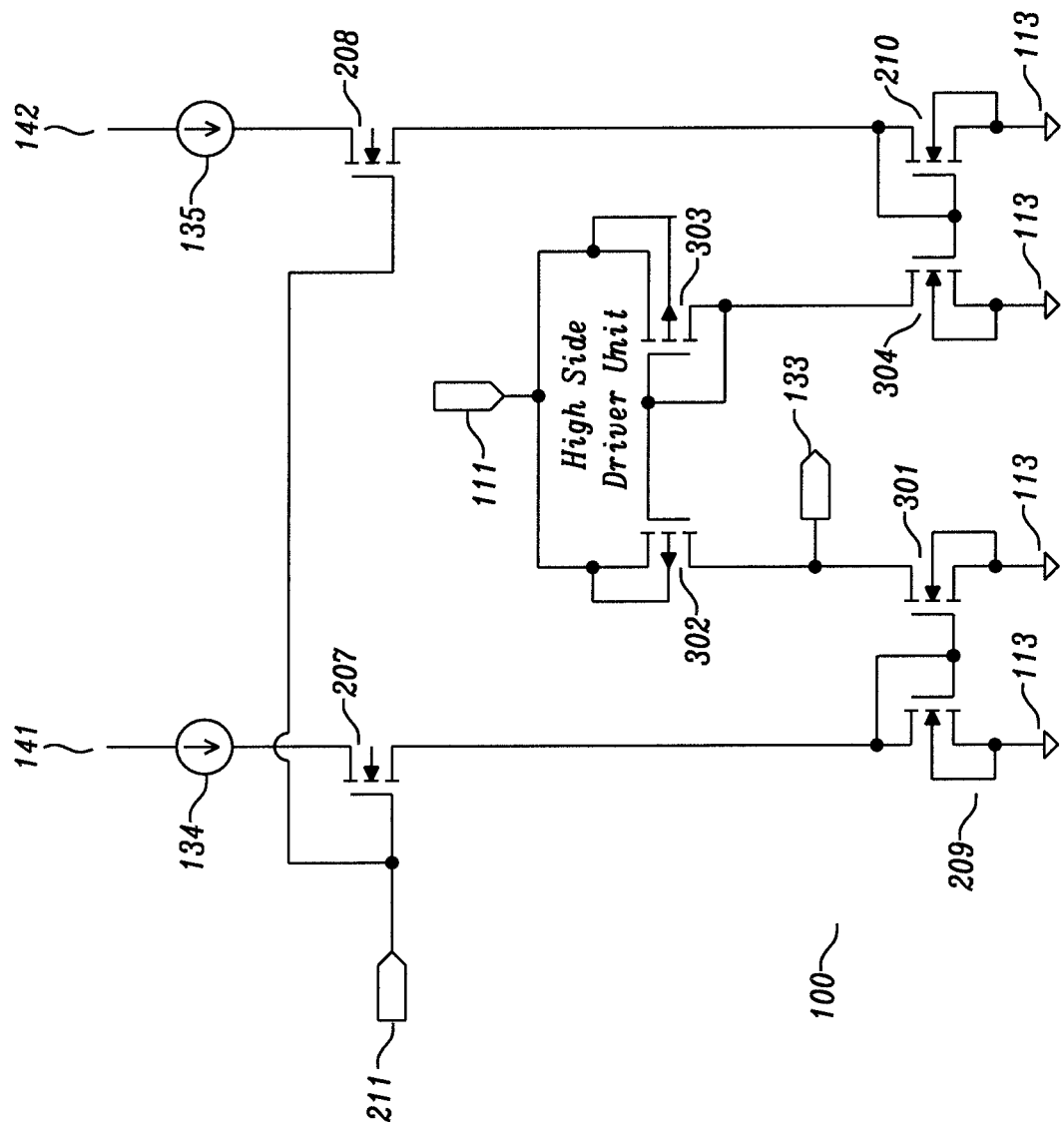
FIG. 3 shows an example differential current comparator.

FIG. 3 shows an example current difference comparator circuit 105. The current Ib 135 defines the Vgs of the sensing transistor M6 210 and the current Ib 135 is mirrored by the mirroring transistors M8 304 and M10 303. The Vgs of the PMOS M10 303 also defines the Vgs of the mirroring transistor M9 302. The current Ia 134 is mirrored by transistors M5 209, M7 301, and M9 302. Because the Vgs of M9 302 is defined by the Vgs of the gate-drain connected M9 302, the Ids current of the transistor M9 302 also sets the operation point of the transistor M9 302, which can move from saturation to the triode region depending on the current difference. If Ia 134 is greater than Ib 135, then the transistor M9 302 is moving forward into saturation and Vds increases causing the data signal 133 to decrease. For Ia 134 being smaller than Ib 135, the device M9 302 goes into the triode region, causing Vds to decrease and the data signal 133 to increase.

Figure 4:
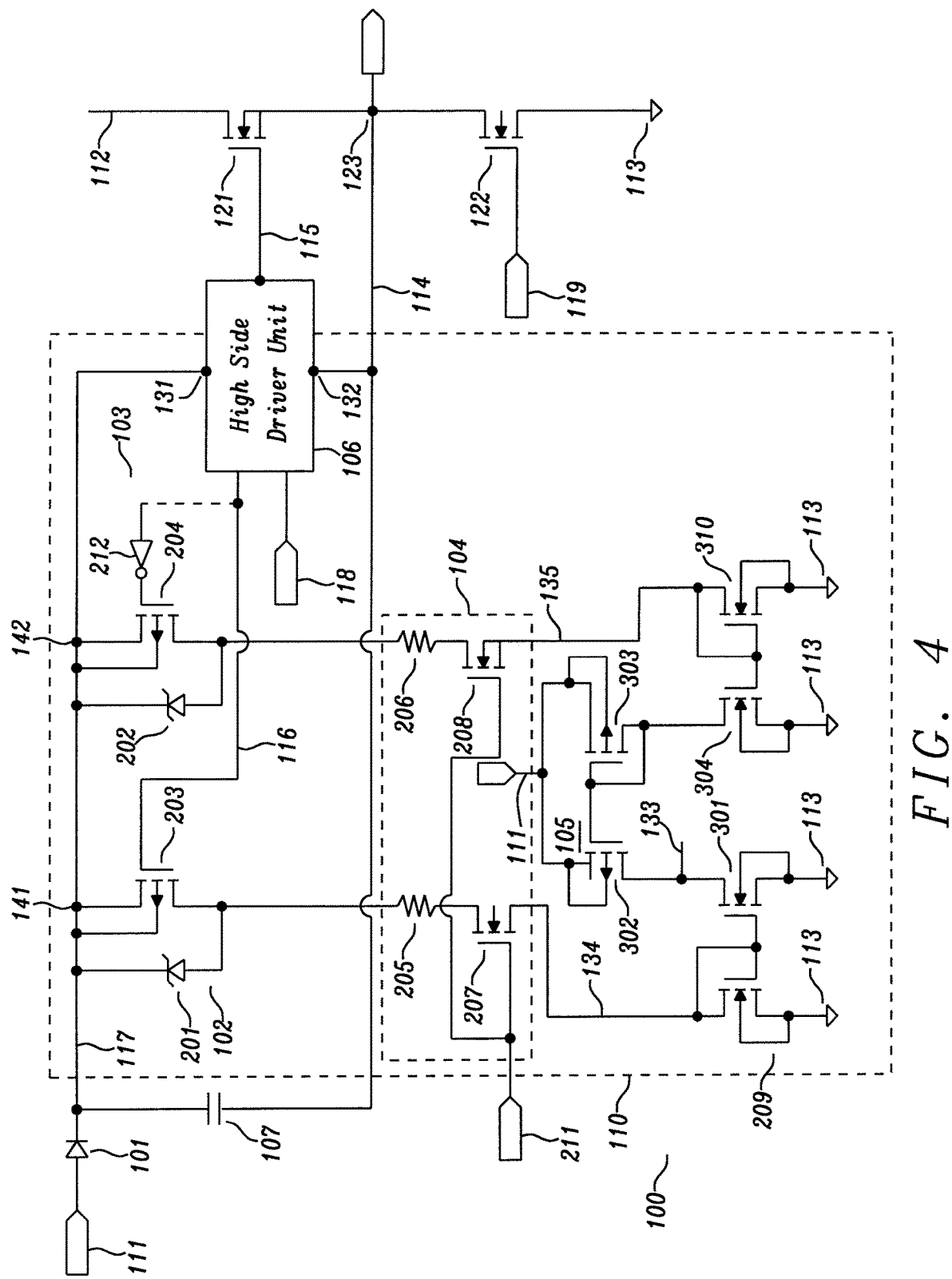
FIG. 4 shows a circuit diagram of an example level-shifter circuit.
Figure 5:
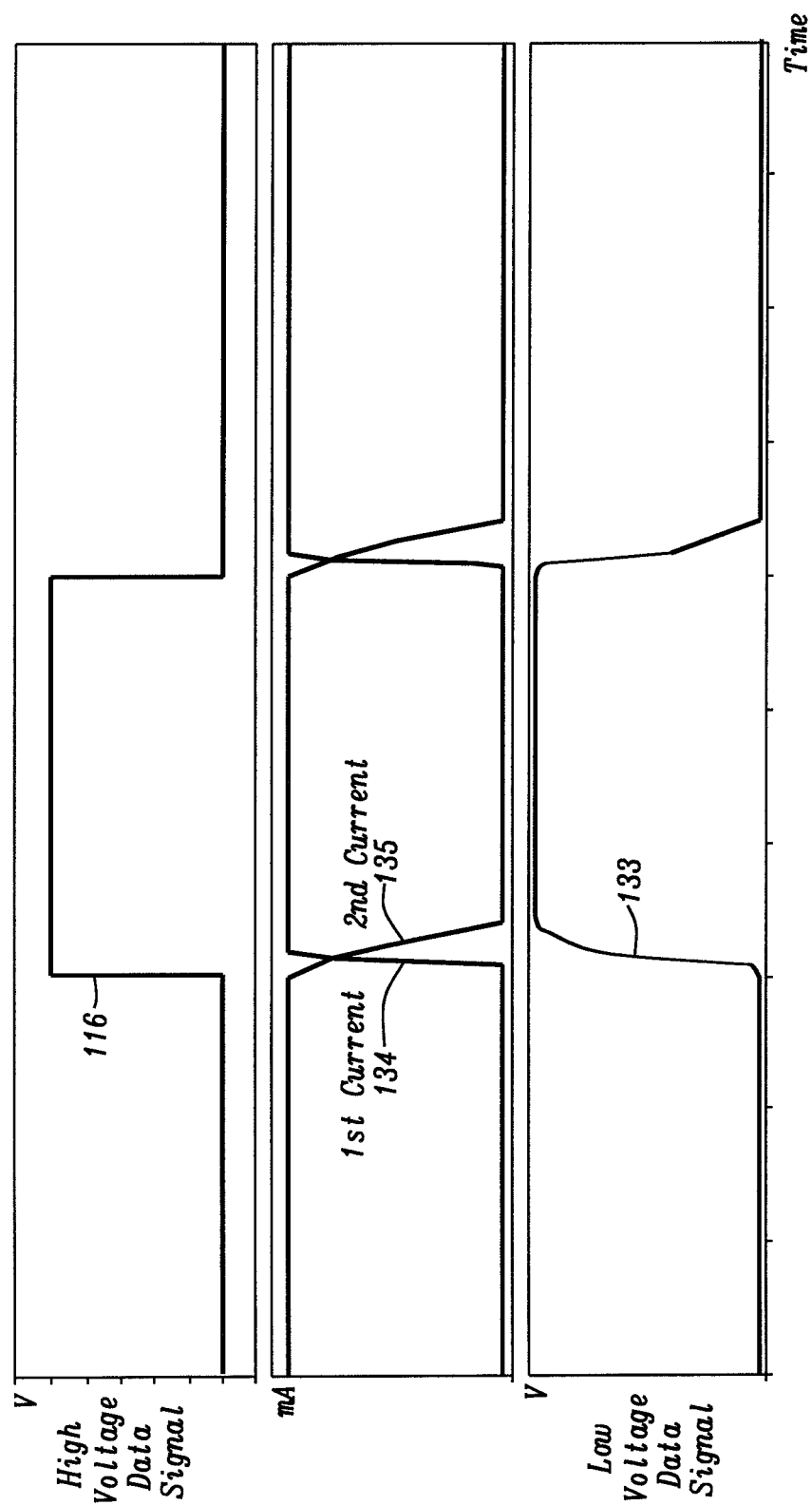
FIG. 5 shows example data signals in the high-voltage domain and in the low-voltage domain.

FIG. 4 show an example circuit diagram of the UHV level shifter circuit 110. Furthermore, FIG. 5 shows simulation results (as functions of the time T) for an input voltage 112 of 400 V, a Zener voltage (Vzener) of 30 V, and isolation resistors R1 and R2 with 100 kΩ to transmit data from the high-side domain to the low-side domain. The current difference in this example is set at around 300 µA, which is detected by the current comparator 105 within the low-side domain.

Hence, a UHV level shifter circuit 110 for data transfer from the high-side domain to the low-side domain is described. The level shifter circuit 110 makes use of relatively low-voltage P-channel FETs 203, 204 (e.g. with a breakthrough voltage of 10V or less) at the high-side device 121 together with high-voltage resistors 205, 206 and high-voltage N-channel devices 207, 208 for HW isolation and power reduction.

The differential current of a first and a second current 134, 135 are used for information coding at the high-side device 121. Two level shifter paths 141, 142 are used with different currents 134, 135 in every path 141, 142, as shown in FIGS. 1, 2A, 2B, and 4. The differential current may be approximately defined by the voltages across the Zener diodes (D2 and D3) 201, 202 and the isolation resistors R1 and R2 205, 206.

The low-voltage p-channel transistors M1 and M2 203, 204 may be driven by an inverted and a non-inverted data signal 116, respectively. As a result of this, only a single PMOS transistor 203, 204 is turned on at a time. The PMOS transistor 203, 204 in ON state generates in its path 141, 142 a higher current of approximately Vzener/R difference (assuming R1=R2=R and Vz_D2=Vz_D1=Vzener) compared to the lower current. Additionally, the Zener diodes 201, 202 may be used to protect the low-voltage PMOS devices M1 and M2 203, 204 from breakdown voltage. Using high-voltage GaN FETs M3 and M4 207, 208 the level shifter circuit 110 may be turned off for reducing the power consumption. The current 134, 135 may be sensed by sensing devices M5 and M6 209, 210, and the sensed currents may be converted to an output data voltage 133 by making use of a differential current comparator 105.

A possible application scenario is a high-voltage circuit 100 with a swing of the LX-node voltage 114 of 600 V or more. Given a current path 141, 142 from the high-side domain to the low-side domain with a current 134, 135 of 1 mA or less, the power dissipation may be up to 0.6 W. In standard high-voltage process technologies only n-channel devices are available. Therefore, standard level-shifting techniques are typically not feasible. In the present document, the use of low-voltage (50 V) devices 203, 204 and high-voltage GaN isolation devices 207, 208 is described for a high-voltage communication. Furthermore, the described implementation of the current comparator 105 in the low-side domain provides an inherent voltage limitation (forward drop) and a high-gain current detection.

Hence, a level-shifter circuit 110 configured to transmit data from a high-voltage domain to a low-voltage domain is described. The high-voltage domain may exhibit high-level voltages of 500V or more. On the other hand, the low-voltage domain may exhibit low-level voltages of 100V or less, or of 10V or less. The high-voltage domain may e.g. be the domain for driving the high-side switch 121, and the low-voltage domain may e.g. be the domain for driving the low-side switch 122 of a half bridge (e.g. of a switched power converter).

The level-shifter circuit 110 may comprise a first current path 141 with a first current control unit 102 which is configured to provide and/or to set a first current 134 based on a high-voltage data signal 116 in the high-voltage domain. The first current path 141 may be arranged between a boot potential 117 and a reference potential 113 (e.g. ground). The boot potential 117 may be varying depending on the state of the high-side switch 121 of the half bridge. In particular, the boot potential 117 may be relatively high (e.g. equal to the input voltage 112 plus a supply voltage 111 and/or minus a diode drop at the diode 101), when the high-side switch 121 is closed.

Furthermore, the level-shifter circuit 110 comprises a second current path 142 with a second current control unit 103 which is configured to provide and/or to set a second current 135 based on the high-voltage data signal 116. The second current path 142 may be arranged between the boot potential 117 and the reference potential 113. The first current path 141 and the second current path 142 may be parallel with respect to one another.

The first current control unit 102 and the second current control unit 103 may be controlled such that data comprised within the high-voltage data signal 116 is encoded into the difference between the first current control unit 102 and the second current control unit 103. In other words, the difference between the first current control unit 102 and the second current control unit 103 may be indicative of the information comprised within the high-voltage data signal 116 (e.g. "1" or "0", or "high level" or "low level").

For this purpose, the level-shifter circuit 110 may comprise an inverter 212 which is configured to generate an inverted high-voltage data signal from the high-voltage data signal 116. The second current control unit 103 may be configured to provide and/or to set the second current 135 based on the inverted high-voltage data signal. In particular, the first current control unit 102 and the second current control unit 103 may be controlled in a complementary manner, to encode the data from the high-voltage data signal 116 into the difference between the first and second currents 134, 135.

In addition, the level shifter circuit 110 comprises an isolation unit 104 which is configured to transfer the first current 134 and the second current 135 from the high-voltage domain to the low-voltage domain. In particular, the first and second currents 134, 135 may be transferred from a voltage level within the high-voltage domain to a voltage level within the low-voltage domain. This may be achieved e.g. using isolation resistors 205, 206 within the first and second current path 141, 142, respectively.

In addition, the level-shifter circuit 110 comprises a current comparator unit 105 which is configured to compare the first current 134 with the second current 135 to provide a low-voltage data signal 133 in the low-voltage domain, which corresponds to the high-voltage data signal 116. In other words, the current comparator unit 105 may be configured to extract the information which has been encoded into the difference between the first current 134 and the second current 135, and to generate a low-voltage data signal 133 which comprises this information. As a result of this, an efficient and reliable data communication between a high-voltage domain and a low-voltage domain may be provided.

The first current control unit 102 may comprise a first current control unit transistor 203 (e.g. a (low-voltage) p-channel metal-oxide semiconductor (PMOS) transistor) configured to derive the first current 134 from the boot potential 117. The first current control unit transistor 203 may be controlled based on the high-voltage data signal 116 (which may be coupled to the gate of the first current control unit transistor 203).

In a similar manner, the second current control unit 103 may comprise a second current control unit transistor 204 (e.g. a (low voltage) PMOS transistor) configured to derive the second current 135 from the boot potential 117. The second current control unit transistor 204 may be controlled based on the high-voltage data signal 116, notably based on the inverted version of the high-voltage data signal 116 (which may be coupled to the gate of the second current control unit transistor 204). By doing this, the data from the high-voltage data signal 116 may be encoded into the first and second current 134, 135 in an efficient and precise manner.

The first current control unit transistor 203 comprises a first port which is (directly) coupled to the boot potential 117 and a second port which is (directly) coupled to the isolation unit 104. The first current control unit 102 may comprise a first Zener diode 201 arranged in a reversed biased manner between the first port and the second port of the first current control unit transistor 203. The breakdown voltage of the first Zener diode 201 may be smaller than the breakdown drain-source voltage of the first current control unit transistor 203, thereby protecting the first current control unit transistor 203.

In a similar manner, the second current control unit transistor 204 comprises a first port which is (directly) coupled to the boot potential 117 and a second port which is (directly) coupled to the isolation unit 104. The second current control unit 103 may comprise a second Zener diode 202 arranged in a reversed biased manner between the first port and the second port of the second current control unit transistor 204. The breakdown voltage of the second Zener diode 202 may be smaller than the breakdown drain-source voltage of the second current control unit transistor 204, thereby protecting the second current control unit transistor 204.

By making use of Zener diodes 201, 202, an efficient and reliable use of low-voltage current control unit transistors 203, 204 is enabled.

Alternatively, or in addition, the first current control unit 102 may comprise a first current control unit resistor 221 arranged between the first port and the second port of the first current control unit transistor 203; and/or the second current control unit 103 may comprise a second current control unit resistor 222 arranged between the first port and the second port of the second current control unit transistor 204. The first and second current control unit resistors 221, 222 may be used to limit the voltage drop across the respective current control unit transistors 203, 204, to enable the use of low-voltage current control unit transistors 203, 204.

A current control unit 102, 103 may be configured to vary the potential or the voltage at the isolation unit 104. In other words, the voltage drop across a current control unit 102, 103 may be modified for setting the current 134, 135 within a current path 141, 142. In particular, by closing the current control unit transistor 203, 204 of a control unit 102, 103, the voltage drop at the current control unit 102, 103 may be reduced, thereby increasing the current 134, 135 within the path 141, 142. On the other hand, by opening the current control unit transistor 203, 204, the voltage drop at the current control unit 102, 103 may be increased, thereby reducing the current 134, 135 within the path 141, 142. Hence, by opening or closing the current control unit transistor 203, 204 of a current control unit 102, 103, the current 134, 135 within the corresponding current path 141, 142 may be set.

The isolation unit 104 may comprise a first isolation resistor 205 on the first current path 141 and a second isolation resistor 206 on the second current path 142. The first and second isolation resistors 205, 206 may be configured to withstand a relatively high-level voltage (e.g. 600V or more) of the high-level voltage domain. Alternatively, or in addition, the first and second isolation resistors 205, 206 may be arranged and/or designed such that the high-side port of the first and second isolation resistors 205, 206 is at a potential within the high-voltage domain (e.g. 600V or more) and the low-side port of the first and second isolation resistors 205, 206 is at a potential within the low-voltage domain (e.g. at 100V or less, or 10V or less). The first and second isolation resistors 205, 206 may be implemented in an efficient manner using GaN (Gallium Nitride) technology. By making use of first and second isolation resistors 205, 206, the first and second currents 134, 135 may be shifted to the low-voltage domain in an efficient and reliable manner.

The first current control unit resistor 221 and the first isolation resistor 205 may form a first resistor divider. The first resistor divider may be dimensioned such that the voltage drop across the first current control unit transistor 203 is lower than the drain-source breakdown voltage of the first current control unit transistor 203. In a similar manner, the second current control unit resistor 222 and the second isolation resistor 206 may form a second resistor divider. The second resistor divider may be dimensioned such that the voltage drop across the second current control unit transistor 204 is lower than the drain-source breakdown voltage of the second current control unit transistor 204. By doing this, an efficient and reliable use of low-voltage current control unit transistors 203, 204 is enabled.

The isolation unit 104 may comprise a first isolation switch 207 (e.g. a field-effect transistor, FET) on the first current path 141 arranged in series with the first isolation resistor 205 (notably at the low-side port of the first isolation resistor 205). The first isolation switch 207 may be opened to disable the first current 134 or closed to enable the first current 134 using an isolation control signal 211. The first isolation switch 207 may be implemented using GaN technology.

In a similar manner, the isolation unit 104 may comprise a second isolation switch 208 (e.g. a FET) on the second current path 142 arranged in series with the second isolation resistor 206 (notably at the low-side port of the second isolation resistor 206). The second isolation switch 208 may be opened to disable the second current 135 or closed to enable the second current 135 using the isolation control signal 211. The second isolation switch 208 may be implemented using GaN technology.

The level-shifter circuit 110 may comprise a control unit 250 which is configured to detect that data is to be transmitted from the high-voltage domain to the low-voltage domain. In reaction to this, the isolation control signal 211 may be set to close the first and second isolation switches 207, 208, thereby enabling the transmission of data from the high-voltage domain to the low-voltage domain. On the other hand, the control unit 250 may be configured to detect that no data is to be transmitted from the high-voltage domain to the low-voltage domain. In reaction to this, the isolation control signal 211 may be set to open the first and second isolation switches 207, 208, thereby disabling the transmission of data from the high-voltage domain to the low-voltage domain. Hence, the currents 134, 135 may be enabled for data communication, thereby reducing the power consumption of the level-shifter circuit 110. By way of example, the high-side switch 121 of a half bridge may be turned on repeatedly with a certain switching frequency. The first and second isolation switches 207, 208 may be turned on and off with the same switching frequency.

The level-shifter circuit 110 may comprise a first current sensing transistor 209 on the first current path 141 configured to sense the first current 134, and a second current sensing transistor 210 on the second current path 142 configured to sense the second current 135. The current comparator 105 may be configured to control a level of an output port based on a first sensed current provided by the first current sensing transistor 209 and a second sensed current provided by the second current sensing transistor 210, in order to provide the low-voltage data signal 113 in a reliable manner at the output port of the current comparator 105.

The first current path 141 may be formed by a serial arrangement comprising the first current control unit transistor 203 (in parallel with the first Zener diode 201 and/or the first current control unit resistor 221), followed by the first isolation resistor 205, followed by the first isolation transistor 207, followed by the first sensing transistor 209, wherein the serial arrangement is arranged between the boot potential 117 and the reference potential 113. In a similar manner, the second current path 142 may be formed by a serial arrangement comprising the second current control unit transistor 204 (in parallel with the second Zener diode 202 and/or the second current control unit resistor 222), followed by the second isolation resistor 206, followed by the second isolation transistor 208, followed by the second sensing transistor 210, wherein the serial arrangement is arranged between the boot potential 117 and the reference potential 113.

Furthermore, a circuit 100 is described (e.g. as part of a switched power converter). The circuit 100 comprises a high-side switch 121 and a low-side switch 122, which are arranged between an input potential 112 and a reference potential 113, and which are coupled to one another at an intermediate node 123 (thereby forming a half bridge). Furthermore, the circuit 100 comprises a high-side driver unit 106 configured to generate a high-side control signal for controlling the high-side switch 121, and configured to provide a high-voltage data signal 116.

In addition, the circuit 100 comprises the level-shifter circuit 110 described in the present document, which is configured to provide a low-voltage data signal 133 based on the high-voltage data signal 116. In addition, the circuit 100 comprises a low-side driver unit configured to generate a low-side control signal 119 for controlling the low-side switch 121 based on the low-voltage data signal 133. As a result of this, an efficient control of the switches 121, 122 of a half-bridge are enabled.

Figure 6:
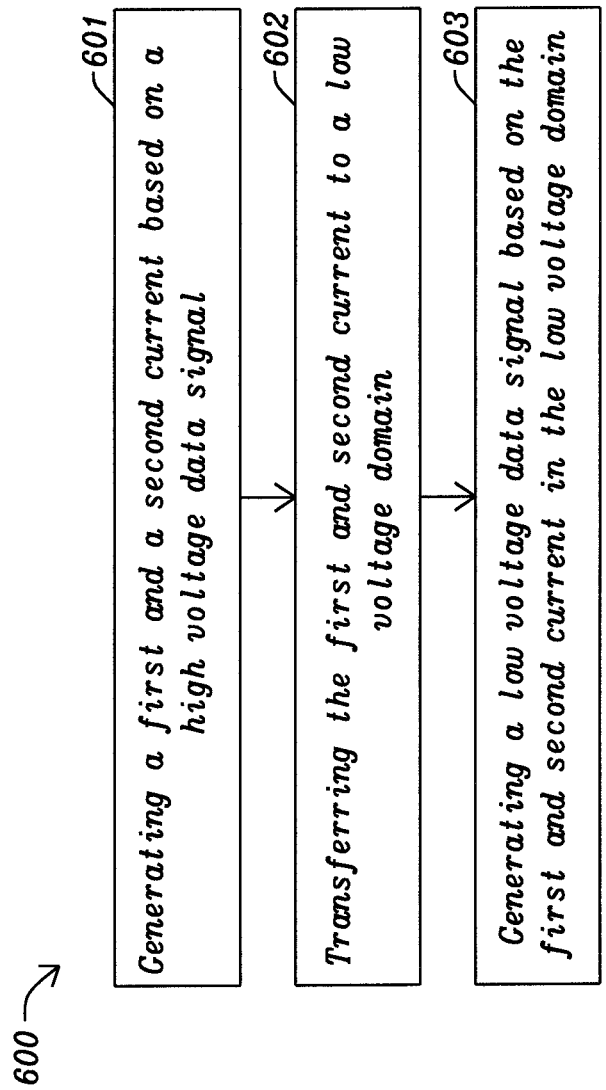
FIG. 6 shows a flow chart of an example method for transferring a data signal from the high-voltage domain to the low-voltage domain.

FIG. 6 shows a flow chart of an example method 600 for transmitting data from a high-voltage domain to a low-voltage domain. The method 600 comprises generating 601 a first current 134 and a second current 135 based on a high-voltage data signal 116 in the high-voltage domain. Furthermore, the method 600 comprises transferring 602 the first current 134 and the second current 135 from the high-voltage domain to the low-voltage domain. In addition, the method 600 comprises comparing 603 the first current 134 with the second current 135 to provide a low-voltage data signal 133 in the low-voltage domain, which corresponds to the high-voltage data signal 116.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A level-shifter circuit configured to transmit data from a high-voltage domain to a low-voltage domain; the level-shifter circuit comprising,
    a first current path with a first current control unit configured to set a first current based on a high-voltage data signal in the high-voltage domain;
    a second current path with a second current control unit configured to set a second current based on the high-voltage data signal;

an isolation unit configured to transfer the first current and the second current from the high-voltage domain to the low-voltage domain; and a current comparator unit configured to compare the first current with the second current to provide a low-voltage data signal in the low-voltage domain, which corresponds to the high-voltage data signal.

2. The level-shifter circuit of claim 1, wherein the first current control unit and the second current control unit are controlled such that data comprised within the high-voltage data signal is encoded into a difference of the first current control unit and the second source.

3. The level-shifter circuit of claim 1, wherein the level-shifter circuit comprises an inverter configured to generate an inverted high-voltage data signal from the high-voltage data signal; and the second current control unit is configured to set the second current based on the inverted high-voltage data signal.

4. The level-shifter circuit of claim 1, wherein the first current control unit comprises a first current control unit transistor configured to derive the first current from a boot potential;

the first current control unit transistor is controlled based on the high-voltage data signal;

the second current control unit comprises a second current control unit transistor configured to derive the second current from the boot potential; and the second current control unit transistor is controlled based on the high-voltage data signal, notably based on an inverted version of the high-voltage data signal.

5. The level-shifter circuit of claim 4, wherein the first current control unit transistor comprises a first port which is coupled to the boot potential and a second port which is coupled to the isolation unit; and the first current control unit comprises a first Zener diode arranged in a reversed biased manner between the first port and the second port of the first current control unit transistor; and/or the second current control unit transistor comprises a first port which is coupled to the boot potential and a second port which is coupled to the isolation unit; and the second current control unit comprises a second Zener diode arranged in a reversed biased manner between the first port and the second port of the second current control unit transistor.

6. The level-shifter circuit of claim 5, wherein a breakdown voltage of the first Zener diode is smaller than a breakdown drain-source voltage of the first current control unit transistor; and/or a breakdown voltage of the second Zener diode is smaller than a breakdown drain-source voltage of the second current control unit transistor.

7. The level-shifter circuit of claim 4, wherein the first current control unit transistor comprises a first port which is coupled to the boot potential and a second port which is coupled to the isolation unit; and the first current control unit comprises a first current control unit resistor arranged between the first port and the second port of the first current control unit transistor; and/or the second current control unit transistor comprises a first port which is coupled to the boot potential and a second port which is coupled to the isolation unit; and the second current control unit comprises a second current control unit resistor arranged between the first port and the second port of the second current control unit transistor.

8. The level-shifter circuit of claim 1, wherein the isolation unit comprises a first isolation resistor on the first current path and a second isolation resistor on the second current path; and the first and second isolation resistors are configured to withstand a high-level voltage of the high-level voltage domain; and/or the first and second isolation resistors are arranged and/or designed such that a high-side port of the first and second isolation resistors is at a potential within the high-voltage domain and a low-side port of the first and second isolation resistors is at a potential within the low-voltage domain.

9. The level-shifter circuit of claim 8, wherein the first current control unit resistor and the first isolation resistor form a first resistor divider; and the first resistor divider is such that a voltage drop across the first current control unit transistor is lower than a drain-source breakdown voltage of the first current control unit transistor; and/or the second current control unit resistor and the second isolation resistor form a second resistor divider; and the second resistor divider is such that a voltage drop across the second current control unit transistor is lower than a drain-source breakdown voltage of the second current control unit transistor.

10. The level-shifter circuit of claim 8, wherein the isolation unit comprises a first isolation switch on the first current path arranged in series with the first isolation resistor;

the first isolation switch can be opened to disable the first current or closed to enable the first current using an isolation control signal;

the isolation unit comprises a second isolation switch on the second current path arranged in series with the second isolation resistor; and the second isolation switch can be opened to disable the second current or closed to enable the second current using the isolation control signal.

11. The level-shifter circuit of claim 10, wherein the level-shifter circuit comprises a control unit configured to detect that data is to be transmitted from the high-voltage domain to the low-voltage domain; and in reaction to this, set the isolation control signal to close the first and second isolation switches; and/or detect that no data is to be transmitted from the high-voltage domain to the low-voltage domain; and in reaction to this, set the isolation control signal to open the first and second isolation switches.

12. The level-shifter circuit of claim 1, wherein the level-shifter circuit comprises a first current sensing transistor on the first current path configured to sense the first current;

the level-shifter circuit comprises a second current sensing transistor on the second current path configured to sense the second current; and the current comparator is configured to control a level of an output port based on a first sensed current provided by the first current sensing transistor and a second sensed current provided by the second current sensing transistor.

13. The level-shifter circuit of claim 1, wherein
the first current path and the second current path are arranged between a boot potential and a reference potential; and/or
the high-voltage domain exhibits a high-level voltage of 500V or more; and/or
the low-voltage domain exhibits a low-level voltage of 10V or less.

14. The level-shifter circuit of claim 1, further comprising,
a high-side switch and a low-side switch, which are arranged between an input potential and a reference potential, and which are coupled to one another at an intermediate node;
a high-side driver unit configured to generate a high-side control signal for controlling the high-side switch, and configured to provide a high-voltage data signal;
wherein the level-shifter circuit is configured to provide a low-voltage data signal based on the high-voltage data signal; and
a low-side driver unit configured to generate a low-side control signal for controlling the low-side switch based on the low-voltage data signal.

15. A method for transmitting data from a high-voltage domain to a low-voltage domain; wherein the method comprises,
generating a first current and a second current based on a high-voltage data signal in the high-voltage domain;
transferring the first current and the second current from the high-voltage domain to the low-voltage domain; and
comparing the first current with the second current to provide a low-voltage data signal in the low-voltage domain, which corresponds to the high-voltage data signal.

* * * * *